United States Patent
Holm Hansen et al.

(10) Patent No.: US 10,735,019 B1
(45) Date of Patent: Aug. 4, 2020

(54) DYNAMIC COMMON MODE CONTROL

(71) Applicant: Infineon Technologies Austria AG, Villach (AT)

(72) Inventors: Thomas Holm Hansen, Værløse (DK); Mikkel Hoyerby, Herlev (DK)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/458,897

(22) Filed: Jul. 1, 2019

(51) Int. Cl.
*H03M 1/66* (2006.01)
*H03F 3/45* (2006.01)

(52) U.S. Cl.
CPC .......... *H03M 1/66* (2013.01); *H03F 3/45183* (2013.01); *H03F 3/45748* (2013.01)

(58) Field of Classification Search
CPC ... H03M 1/66; H03F 3/45748; H03F 3/45183
USPC .................................................. 341/144, 120
See application file for complete search history.

(56) References Cited

U.S. PATENT DOCUMENTS

| | | | | |
|---|---|---|---|---|
| 8,076,973 B2 * | 12/2011 | Yang | .................. | H03F 3/45183 330/258 |
| 8,350,736 B2 * | 1/2013 | Chern | ................. | H03M 1/1019 324/142 |
| 9,130,582 B2 * | 9/2015 | Cyrusian | ............. | H03M 1/0845 |
| 10,291,246 B2 * | 5/2019 | Chandra | ............. | H03M 1/1023 |

* cited by examiner

*Primary Examiner* — Brian K Young
(74) *Attorney, Agent, or Firm* — Armis IP Law, LLC

(57) ABSTRACT

An apparatus such as an electronic circuit includes an input operable to receive an input signal; a dynamic common mode adjustor operable to: i) derive a differential signal from the received input signal, and ii) control an offset of the differential signal as a function of the received input signal to produce an offset differential signal; and an output operable to output the offset differential signal. In one arrangement, the offset differential signal outputted from the output includes a first signal and a second signal; a difference between the second signal and the first signal proportionally varies with respect to the received input signal.

33 Claims, 8 Drawing Sheets

DYNAMIC COMMON MODE CONTROL

BACKGROUND

A conventional differential DAC (Digital-to-Analog Converter) typically has a fixed common-mode DC voltage setting at its respective output. For example, a conventional differential digital-to-analog converter device can be configured to receive an input signal. The digital-to-analog converter produces an output voltage whose magnitude varies depending on the input signal.

Typically, the common mode setting of the conventional digital-to-analog converter is selected to an appropriate fixed common mode DC value to optimize its full-scale output signal swing. Since the common-mode setting of a conventional digital-to-analog converter is constant or fixed, it typically does not provide peak performance at low level signals (i.e., signals that are fairly low in magnitude).

BRIEF DESCRIPTION

This disclosure includes the observation that electronic circuitry (such as a digital-to-analog converter and/or corresponding circuitry) typically operates more efficiently when an output voltage is set to an appropriate common mode voltage. In certain instances, this means that a desirable common mode voltage may be different depending on a magnitude of the output voltage being generated.

Embodiments herein include novel ways of providing improved circuit performance associated with a digital-to-analog converter and/or related circuitry. For example, one embodiment herein includes dynamically controlling a common-mode setting of a differential signal depending at least in part on a magnitude of an input signal from which the output signal is derived. Providing signal-dependent common-mode control as described herein increases system performance for parameters such as noise, distortion, and power consumption associated with a respective electronic circuit.

More specifically, in one embodiment, an apparatus (such as an electronic circuit) providing improved system performance comprises: an input operable to receive an input signal; a dynamic common mode adjustor operable to: i) derive a differential signal from the received input signal, and ii) vary an offset of the differential signal as a function of a magnitude or level of the received input signal to produce an offset differential signal; and an output operable to output the offset differential signal. As previously discussed, controlling an offset (such as common mode setting) associated with a differential signal provides increased system performance for parameters such as noise, distortion, and power consumption of a corresponding electronic circuit.

Typically, the dynamic common mode adjustor as described herein is instantiated as an electronic circuit such as associated with a digital-to-analog converter, amplifier, etc. However, the dynamic common mode adjustor can be implemented in any suitable manner depending on the embodiment.

In further example embodiments, the offset differential signal outputted from the output includes a first signal component and a second signal component; the dynamic common mode adjustor is operable to apply the generated offset value (common mode adjustment) to both the first signal and the second signal to control a respective common mode setting.

Yet further, a magnitude of a difference between the second signal and the first signal proportionally varies with respect to a magnitude of the received input signal. In other words, in one embodiment, the dynamic common mode adjustor varies a magnitude of the differential signal depending on a magnitude or level of the received input signal. Accordingly, certain embodiments herein include controlling a common mode setting of the differential output signal as well as a magnitude of the differential output signal depending on a magnitude or level of the input signal being converted.

In one embodiment, the received input signal is a digital signal; the differential signal derived from the received input signal is an analog signal.

Adjustment of the common mode setting or offset associated with a differential output signal can include any of multiple techniques. For example, in one embodiment, the dynamic common mode adjustor includes or has access to map information. The map information provides a mapping of input values to corresponding differential output values. During operation, the dynamic common mode adjustor derives the differential signal via mapping of a magnitude of the received input signal to a first value and second value specified by the mapping information. In one embodiment, the first value and the second value represent settings of a pair signals representing the differential output signal whose common mode setting is adjusted.

In accordance with further embodiments, the dynamic common mode adjustor can be configured to apply a piecewise linear math function to derive the offset (common mode settings) associated with the differential signal.

In yet further embodiments, the dynamic common mode adjustor is operable to implement one or more polynomial (mathematical) functions to produce the offset that is applied to a respective differential signal derived from the received input signal.

In accordance with further embodiments, in addition to a dynamic common mode adjustor, the electronic circuit as described herein can be configured to include a digital-to-analog converter circuit operable to receive the offset differential signal. The digital-to-analog converter generates a respective differential analog output signal (current or voltage signal) from the offset differential signal received from the dynamic common mode adjustor.

Note further that the digital-to-analog converter circuit can be configured to include a first digital-to-analog converter and a second digital-to-analog converter. In such an instance, the first digital-to-analog converter converts the first digital value into a first analog output signal (voltage signal or current signal); the second digital-to-analog converter operable to convert the second digital value into a second analog output signal (voltage signal or current signal). The respective differential analog output signal includes the first analog output signal (such as voltage signal or current signal) and the second analog output signal (such as voltage signal or current signal).

In yet further embodiments, the dynamic common mode adjustor includes an offset adjustor operable to generate the offset used to control a common mode setting associated with the differential signal. In one embodiment, the offset adjustor generates (or controls) a magnitude of the offset to be a fixed value during operating conditions in which the magnitude or level of the received input signal falls within a first magnitude range (such as when an absolute value of a magnitude of the input signal is less than threshold value). The offset adjustor can be configured to vary a magnitude or level of the offset during operating conditions in which the magnitude of the received input signal falls within a second magnitude range. Accordingly, the dynamic common mode adjustor can be configured to adjust the common mode setting of an output signal (such as voltage signal or current signal) to ensure further efficient processing of the output signal (voltage signal or current signal).

These and other more specific embodiments are disclosed in more detail below.

Note further that although embodiments as discussed herein are applicable to electronic circuits such as those implementing digital-to-analog converters, amplifiers, differential signal generators, etc., the concepts disclosed herein may be advantageously applied to any other suitable topologies as well as general power supply control applications.

Additionally, note that embodiments herein can include computer processor hardware (that executes corresponding switch instructions) to carry out and/or support any or all of the method operations disclosed herein. In other words, one or more computerized devices or processors (computer processor hardware) can be programmed and/or configured to operate as explained herein to carry out different embodiments of the invention.

Yet other embodiments herein include software programs to perform the steps and operations summarized above and disclosed in detail below. One such embodiment comprises a computer program product that has non-transitory computer-storage media (e.g., memory, disk, flash, . . . ) including computer program instructions and/or logic encoded thereon that, when performed in a computerized device having a processor and corresponding memory, programs the processor to perform any of the operations disclosed herein. Such arrangements are typically provided as software instructions, code, and/or other data (e.g., data structures) arranged or encoded on a computer readable storage medium or non-transitory computer readable media such as an optical medium (e.g., CD-ROM), floppy or hard disk or other a medium such as firmware or microcode in one or more ROM or RAM or PROM chips, an Application Specific Integrated Circuit (ASIC), circuit logic, etc. The software or firmware or other such configurations can be installed onto a respective controller circuit to cause the controller circuit (such as logic) to perform the techniques explained herein.

Accordingly, one embodiment of the present disclosure is directed to a computer program product that includes a computer readable medium having instructions stored thereon for supporting operations such as controlling one or more phases in a power supply. For example, in one embodiment, the instructions, when carried out by computer processor hardware (one or more computer devices, control logic, digital circuitry, etc.), cause the computer processor hardware to: receive an input signal; derive a differential signal from the received input signal; control an offset of the differential signal as a function of the received input signal to produce an offset differential signal; and output the offset differential signal.

The ordering of the operations as described herein has been added for clarity sake. The operations can be performed in any suitable order.

It is to be understood that the system, method, device, apparatus, logic, etc., as discussed herein can be embodied strictly as hardware (such as analog circuitry, digital circuitry, logic, etc.), as a hybrid of software and hardware, or as software alone such as within a processor, or within an operating system or a within a software application.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

Figure 1:
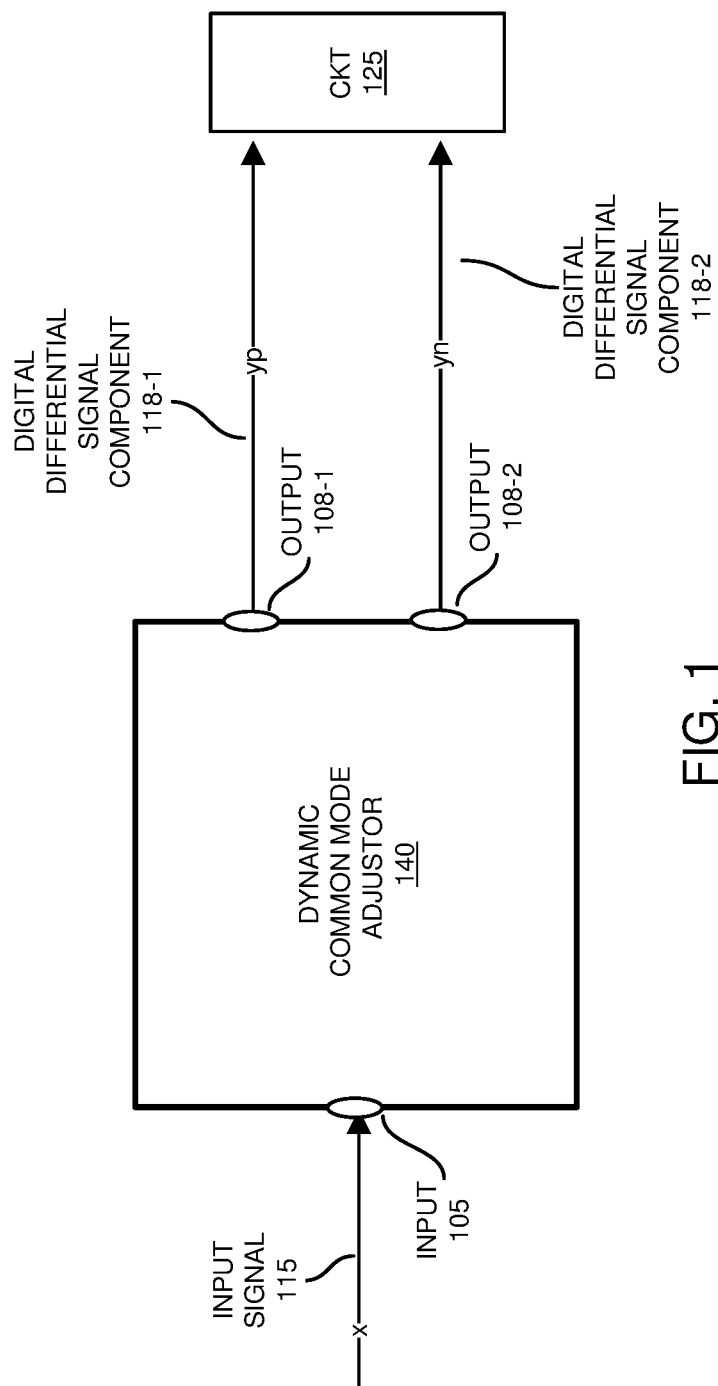
FIG. 1 is an example diagram illustrating a dynamic common mode adjustor according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

According to one embodiment, an apparatus such as an electronic circuit includes an input operable to receive an input signal; a dynamic common mode adjustor operable to: i) derive a differential signal from the received input signal, and ii) vary an offset of the differential signal as a function of a magnitude or level of the received input signal to produce an offset differential signal; and an output operable to output the offset differential signal. In one configuration, the offset differential signal outputted from the output includes a first signal and a second signal; a magnitude or amount of a difference between the second signal and the first signal proportionally varies with respect to a magnitude or level of the received input signal.

Now, more specifically, FIG. 1 is an example diagram illustrating general components of a multi-stage amplifier device according to conventional techniques.

As previously discussed, embodiments herein include novel ways of providing improved circuit performance associated with a digital-to-analog converter and/or related circuitry. For example, one embodiment herein includes dynamically controlling a common-mode setting of a differential DAC, depending on a magnitude of the input signal being converted into a respective analog signal (such as a differential output signal proportional to the input). Providing signal-dependent common-mode control as described herein provides increased system performance for parameters such as noise, distortion, and power consumption. In other words, dynamically modifying a common mode setting (or offset) associated with a generated signal (such as voltage or current signal) supports lower noise, lower distortion and lower power consumption.

In this example embodiment, an apparatus (such as an electrical circuit, device, hardware, software, etc.) includes a dynamic common mode adjustor 140. Typically, the dynamic common mode adjustor 140 as described herein is instantiated as an electronic circuit such as associated with a digital-to-analog converter, amplifier, etc. However, the dynamic common mode adjustor 140 can be implemented in any suitable manner depending on the embodiment.

Further in this example embodiment, the dynamic common mode adjustor 140 includes: an input 105 (such as a port, pin, etc.) that receives an input signal 115 (such as signal x). The dynamic common mode adjustor 140 further includes an output 108 (such as output 108-1 and output 108-2) that outputs an output signal 118 (such as signal y).

In one embodiment, the output signal 108 is a differential signal including digital differential signal component 118-1 (such as signal yp) and digital differential signal component 118-2 (such as signal yn).

During operation, as previously discussed, the dynamic common mode adjustor 140: i) derives differential signal 118 (differential signal y) from the received input signal, and ii) varies an offset of the differential signal 118 as a function of a magnitude or level of the received input signal 115.

For example, the dynamic common mode adjustor 140 outputs the offset differential signal 118 from the output 108. More specifically, the dynamic common mode adjustor 140 outputs digital differential signal component 118-1 (first signal such as yp) from output 108-1 to entity such as circuit 125; the dynamic common mode adjustor 140 outputs digital differential signal component 118-2 (second signal such as yn) from output 108-2 to entity such as circuit 125.

In accordance with further embodiments, the received input signal 115 is an analog or digital signal; the differential signal derived from the received input signal is an analog signal or digital signal.

As previously discussed, controlling an offset (such as common mode setting) associated with differential signal 118 provides increased system performance for parameters such as noise, distortion, and power consumption.

Figure 2:
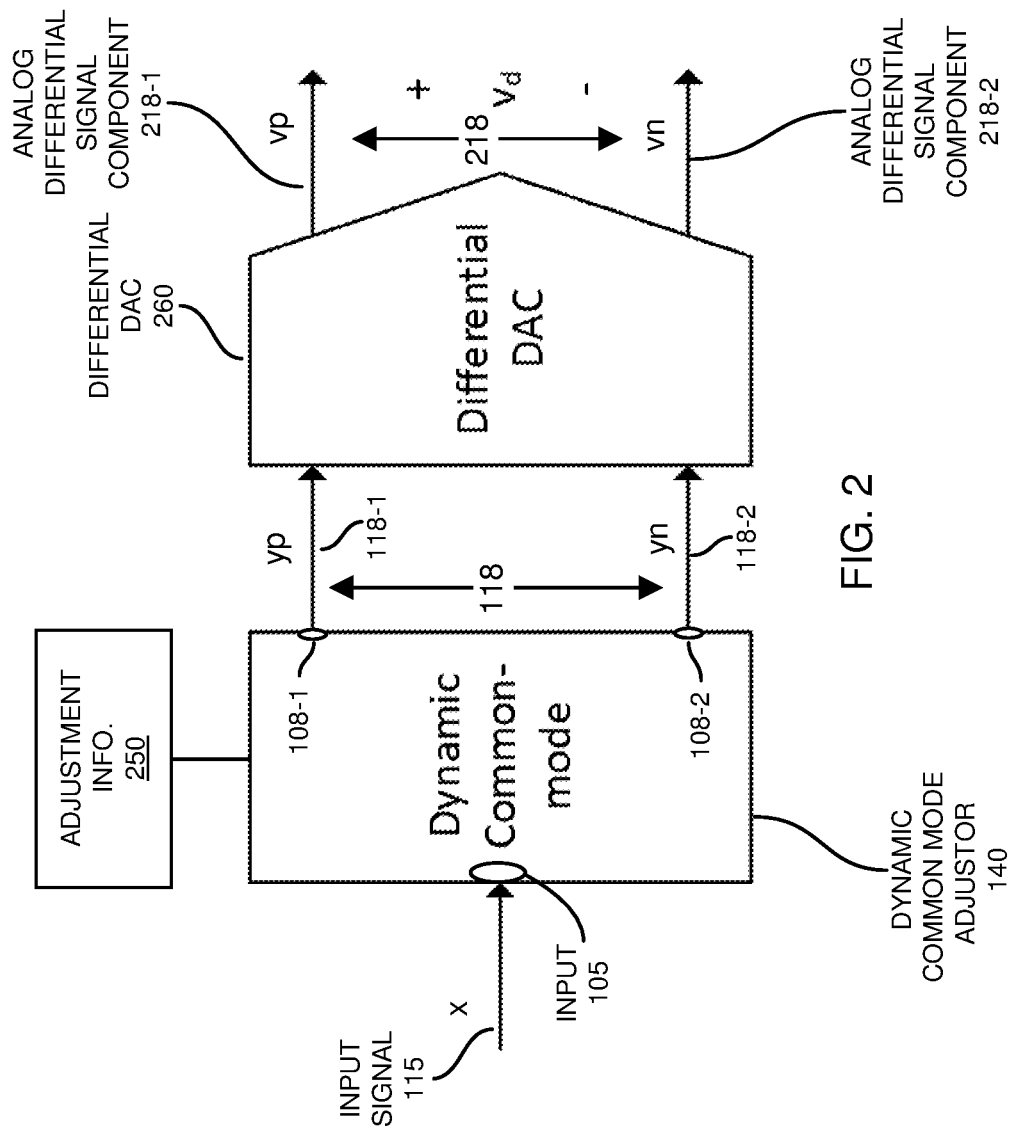
FIG. 2 is an example diagram illustrating implementation of a dynamic common mode adjustor and digital-to-analog converter according to embodiments herein.

FIG. 2 is an example diagram illustrating implementation of a dynamic common mode adjustor and digital-to-analog converter according to embodiments herein.

As shown in this example embodiment, the offset differential signal 118 outputted from the output 108 of dynamic common mode adjustor 140 includes first signal yp (such as digital differential signal component 118-1) and a second signal yn (such as digital differential signal component 118-2).

As previously discussed, the dynamic common mode adjustor 140 applies a generated offset (common mode adjustment value) to control a respective common mode setting of the output signal 118 (differential signal such as including digital differential signal component 118-1 and digital differential signal component 118-2) outputted downstream to the differential digital-to-analog converter 260.

As further shown, the differential digital-to-analog converter 260 receives the differential signal 118 and converts it into the analog output signal 218 (such as analog voltage Vd). In one embodiment, the output signal 218 is a differential analog signal comprising analog differential signal component 218-1 (signal yp) and analog differential signal component 218-2 (signal yn). In such an instance, via the differential digital-to-analog converter 260, the digital differential signal component 118-1 (yp) is converted into corresponding equivalent analog voltage or current signal vp (such as differential signal component 218-1); via the differential digital-to-analog converter 260, the digital differential signal component 118-2 (yn) is converted into corresponding equivalent analog voltage or current signal vn (such as differential signal component 218-2).

Yet further, as previously discussed, a difference between the values yp and yn (as well as vp and vn) proportionally varies with respect to a level of the received input signal 115. In other words, in one embodiment, the dynamic common mode adjustor 140 varies a magnitude of the differential signal Vd depending on a magnitude or level of the received input signal 115.

Accordingly, certain embodiments herein include controlling a common mode setting of the differential output signal pair vp and vn (such as [vp+vn]/2) as well as a magnitude of the differential output signal Vd depending on a magnitude of the input signal 115 (signal x) being converted.

In one embodiment, a magnitude of the voltage Vd (difference between voltage vp and voltage vn) is proportional to the input signal x (such as over a range of multiple input values of signal x). Additionally, or alternatively, the magnitude of the output voltage proportionally tracks a magnitude of the input signal 115.

Accordingly, in addition to a dynamic common mode adjustor 140, embodiments herein can be configured to include a digital-to-analog converter 260 that receives the offset differential signal 118 and generates, from it, a respective differential analog output voltage signal 218 (analog voltage Vd).

Note that adjustment of the common mode setting or offset associated with the differential output signal 118 and thus differential output signal 218 can include any of multiple techniques.

For example, in one embodiment, the dynamic common mode adjustor 140 includes or has access to adjustment information 250. Adjustment information 250 includes any suitable information enabling generation of an appropriate offset value (or common mode setting) to apply to the differential signals 118, 218.

Figure 3:
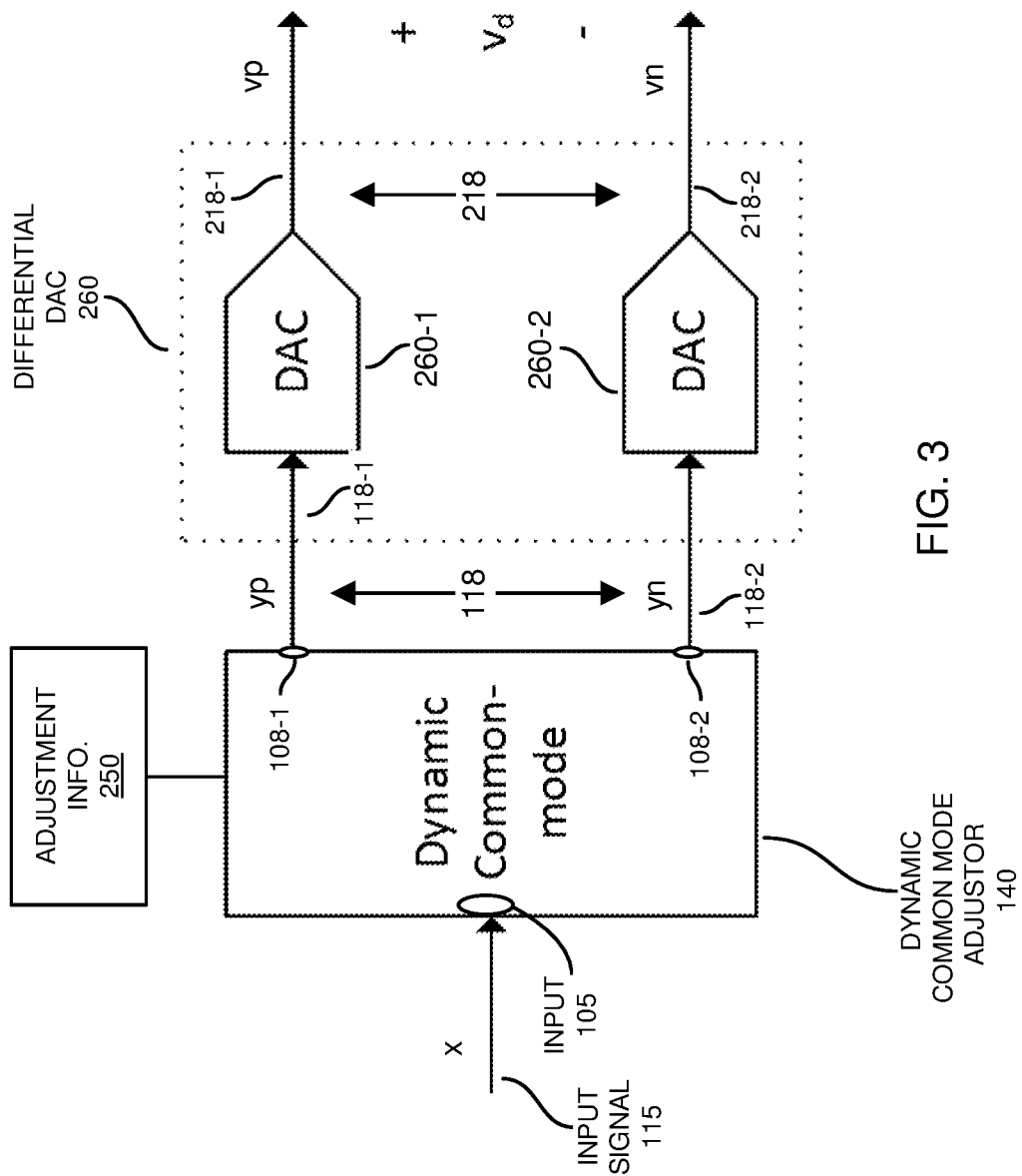
FIG. 3 is an example diagram illustrating implementation of a dynamic common mode adjustor and digital-to-analog converter circuit according to embodiments herein.

FIG. 3 is an example diagram illustrating implementation of a dynamic common mode adjustor and digital-to-analog converter according to embodiments herein.

In this example embodiment, the differential digital-to-analog converter 260 includes two digital-to-analog converters (namely, digital-to-analog converter 260-1 and digital-to-analog converter 260-2).

During operation, the first digital-to-analog converter 260-1 converts the first digital value 118-1 (such as signal yp) into a first analog output signal 218-1 (such as analog voltage or current vp); the second digital-to-analog converter 260-2 converts the second digital value 118-2 into a second analog output signal 218-2 (such as analog voltage or current vn).

In a similar manner as previously discussed, a magnitude and offset (common mode setting) of the respective differential analog output signal, Vd, varies depending on a magnitude of the input signal 115, and on the adjustment information 250.

Figure 4:
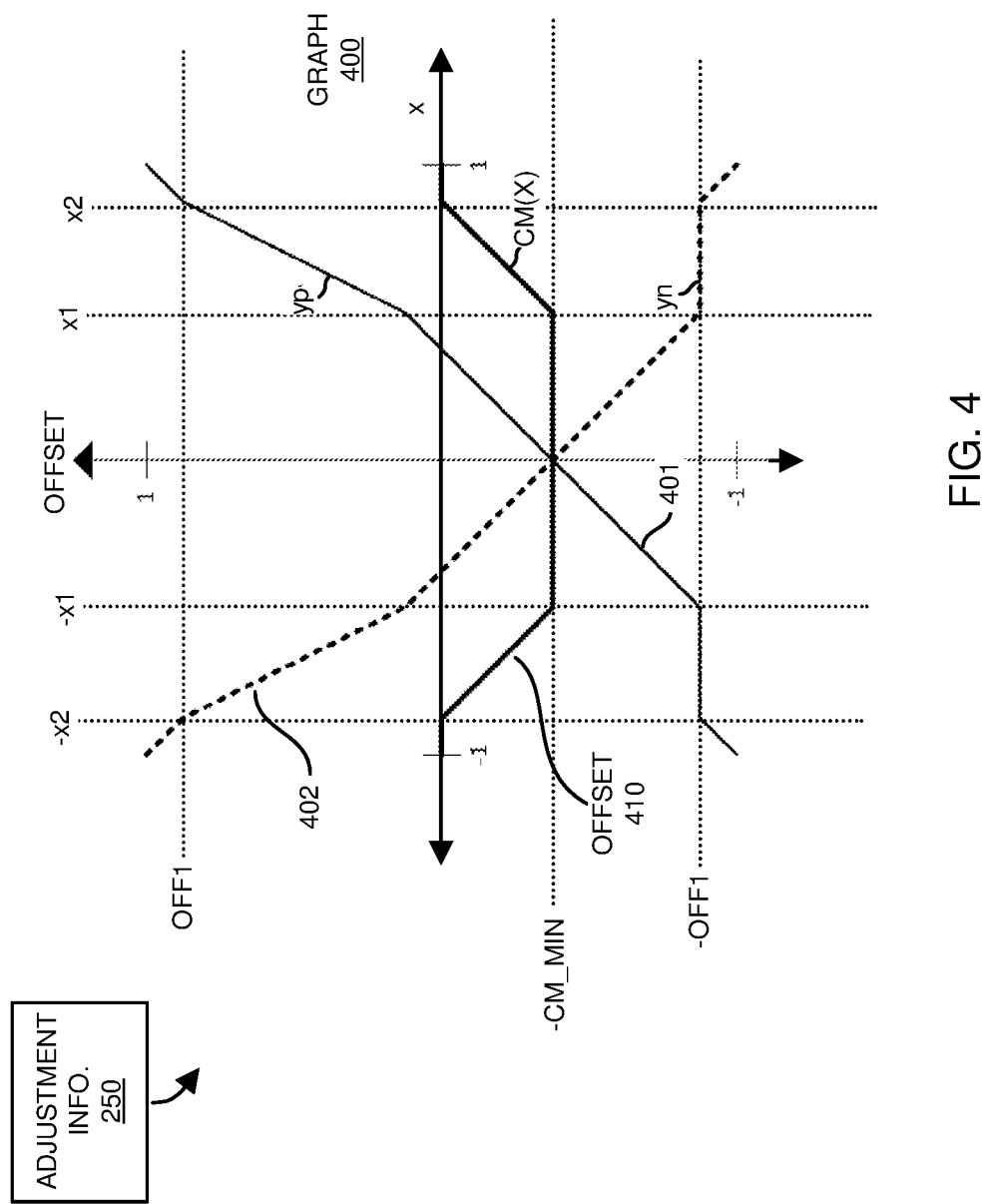
FIG. 4 is an example graph illustrating variation of common mode settings depending on an input according to embodiments herein.

FIG. 4 is an example graph illustrating variation of common mode settings depending on an input according to embodiments herein.

In one embodiment, graph 400 and corresponding functions 401, 402, and 410 represent an instantiation of the adjustment information 250 used to derive differential signal 118 and/or corresponding common mode adjustment settings from the input signal 115. As further shown, the adjustment information 250 can be implemented via one or more piece-wise linear functions that provide different common mode adjustment settings over a range of different input or output values.

More specifically, in this example embodiment, the X-axis represents different possible values of the input signal 115; the Y-axis represents a value of a corresponding offset/output signal.

Function 401 indicates one embodiment of mapping the input signal 115 (signal x) to a corresponding value of signal yp for a range of different input values; function 402 indicates an embodiment of mapping of the input signal 115 (signal x) to a corresponding value of signal yn for a range of different input values.

Note that attributes (slopes, number of linear pieces, offset, etc.) of functions 401 and 402 can be adjusted to accommodate any desirable common mode settings.

As previously discussed, in accordance with further embodiments, the combination of signal yn and yp is a differential signal 118. Applications of function 401 to produce signal yn and application of function 402 to produce signal yp result in a corresponding differential signal 118 having a common mode setting as indicated by function CM (x) in graph 400.

When the input signal 115 falls within a first range between −x1 and x1 (such as when an absolute value of the input signal is less than threshold value x1), the common mode setting of the differential signal 118 and signal 218 is a fixed value −CM_MIN.

When the input signal 115 falls between a first range between −x2 and −x1 or between range x1 and x2, the common mode setting of the differential signal 118 and 218 varies as shown with respect to the input voltage 115.

When the received input signal 115 is less than −x2 or greater than x2 (such as when an absolute value of the input signal is greater than threshold value x2), the common mode setting of the differential signal 118 and signal 218 is substantially zero.

As previously discussed, the adjustment information 250 can be configured as map information that maps input values (associated with signal x) to different corresponding differential output values. For example, during operation, the dynamic common mode adjustor 140 can be configured to derive the differential signal via mapping of the received input signal 115 (signal x) to a first value and second value specified by the mapping information. As a more specific example, assume that the input signal is 0.4. In such an instance, the dynamic common mode adjustor 140 uses adjustment information to map the value 0.2 to −0.2 (signal vp=−0.2) and −0.6 (signal vn=−0.6), in which the common mode or offset is −0.4. The difference between the signal vp and vn is 0.4 (two times the input signal of 0.2). In continuation of same example, assume the input signal is changed to be 0.4. The dynamic common mode adjustor 140 uses the adjustment information to map the value 0.4 to −0.0 (signal yp=−0.0) and −0.8 (signal vn=−0.8), in which the common mode or offset is still −0.4. The difference between the signal yp and vn is 0.8 (two times the input signal of 0.4).

Example mapping is further discussed below.

In one embodiment, the first signal value and the second signal value generated by the dynamic common mode adjustor 140 via mapping represent settings of a pair of signals (such as yp and yn) representing the differential output signal 118.

Note that map information (such as a look-up table, etc.) can include a piece-wise linear math function (as illustrated in graph 400) to derive the offset (common mode settings) associated with the differential signals 118, 218.

In yet further embodiments, the dynamic common mode adjustor 140 implements (via signal processing) one or more polynomial (mathematical) functions to produce the offset that is applied to a respective differential signal 118, 218 derived from the received input signal 115.

Figure 5:
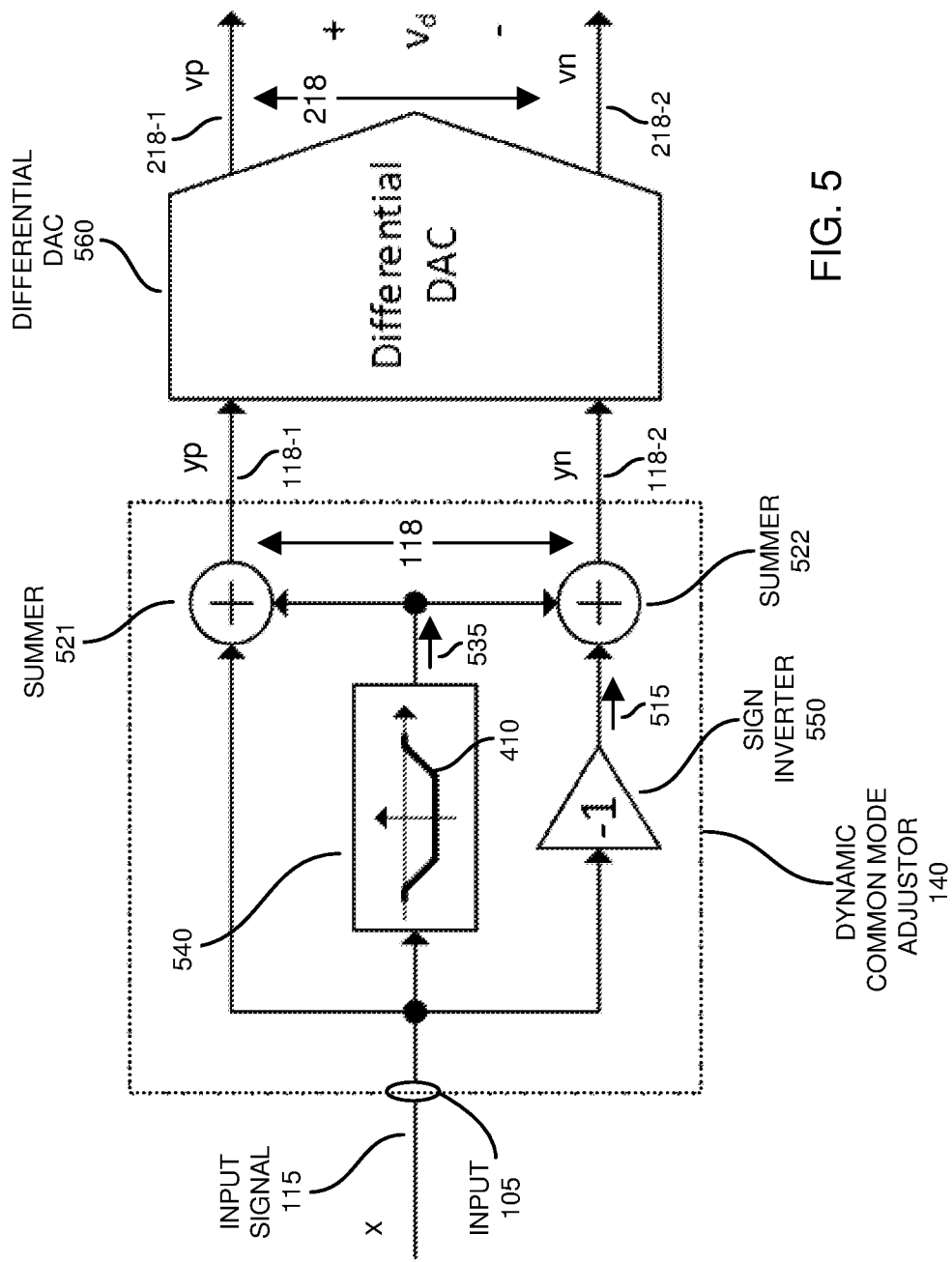
FIG. 5 is an example diagram illustrating implementation of a dynamic common mode adjustor and a differential digital-to-analog converter according to embodiments herein.

FIG. 5 is an example diagram illustrating implementation of a dynamic common mode adjustor and a differential digital-to-analog converter according to embodiments herein.

As shown in FIG. 5, an instantiation of the dynamic common mode adjustor 140 can be configured to include summer 521, summer 522, sign inverter 550 (gain of −1), and adjustor 540.

In such an embodiment, during operation, the adjustor 540 receives the input signal 115. Via function 410, the adjustor 540 outputs a respective common mode adjustment signal 535 [having a value of CM(x)] to both summer 521 and summer 522. Sign inverter 550 applies a gain of −1 to the input signal 115 to produce signal 515 (−x).

As its name suggests, summer 521 adds the common mode adjustment signal 535 and the input signal 115 to produce the digital differential signal component 118-1 (signal yp, where yp=x+CM (x)). Summer 522 adds the common mode adjustment signal 535 and the inverted input signal 515 (−x) to produce the digital differential signal component 118-2 (signal yn, where yn=−x+CM (x)).

Accordingly, the dynamic common mode adjustor 140 modifies the common mode setting associated with the differential signals 118 and 218 depending on a magnitude of the input signal 115.

As previously discussed, the adjustment signal 535 (or offset 410) is constant (such as −CM_MIN) for magnitudes of signal 115 between −x1 and x1; adjustment signal 535 (or offset 410) varies for magnitudes of signal 115 between −x2 and −x1 and between x1 and x2; adjustment signal 535 (or offset 410) is set to zero for values of signal 115 less than −x2 and greater than x2.

Figure 6:
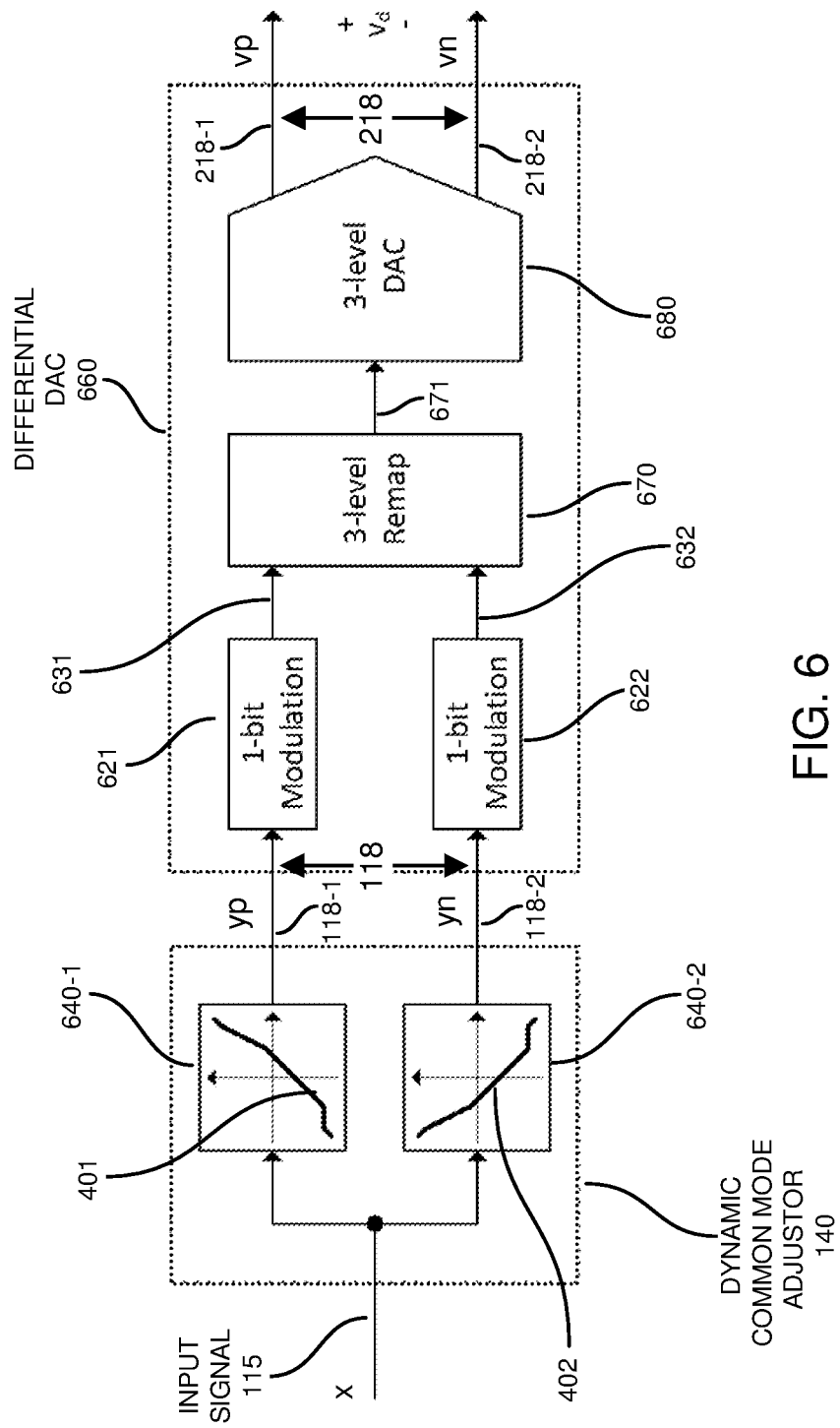
FIG. 6 is an example diagram illustrating implementation of a dynamic common mode adjustor and a differential digital-to-analog converter according to embodiments herein.

FIG. 6 is an example diagram illustrating implementation of a dynamic common mode adjustor and a differential digital-to-analog converter according to embodiments herein.

In this example embodiment, the dynamic common mode adjustor 140 includes adjustor 640-1 and adjustor 640-2.

In this instance of the dynamic common mode adjustor 140, the adjustor 640-1 implements function 401 to convert the input signal 115 to digital differential signal component 118-1; the adjustor 640-2 implements function 402 to convert the input signal 115 to digital differential signal component 118-2.

As further shown, differential digital-to-analog converter 660 receives the differential signal 118 and converts it into respective analog differential signal 218. For example, in one embodiment, the differential digital-to-analog converter 660 includes modulator 621, modulator 622, remapper 670, and 3-level digital-to-analog converter 680.

Further, during operation, the modulator 621 receives digital differential signal component 118-1 and converts it into signal 631 (such as a serial stream representing the digital differential signal component 118-1).

The modulator 622 receives digital differential signal component 118-2 and converts it into signal 632 (such as a serial stream representing the digital differential signal component 118-2).

As further shown, and as its name suggests, the remapper 670 converts a combination of the received signals 631 and 632 into signal 671 representative of the differential signal. Finally, digital-to-analog converter 680 converts the signal 671 into the differential signal 218.

Thus, functions 401 and 402 implemented by the adjustors 640-1 and 640-2 provide different common mode adjustments depending on a magnitude of the input signal 115. Note again that the functions 401 and 402 can be adjusted to accommodate any desirable common mode settings.

Figure 7:
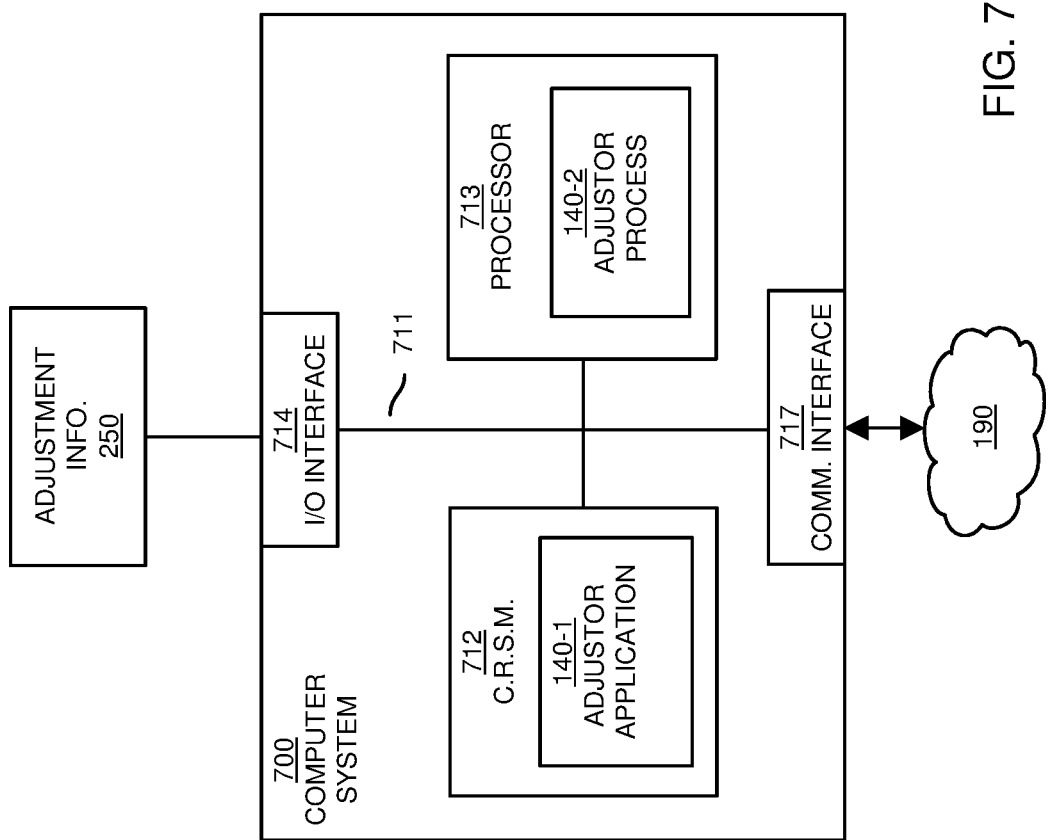
FIG. 7 is an example diagram illustrating computer processor hardware and related software instructions or logic circuit to execute methods according to embodiments herein.

FIG. 7 is an example block diagram of a computer device for implementing any of the operations as discussed herein according to embodiments herein.

As shown, computer system 700 (such as implemented by any of one or more resources such as dynamic common mode adjustor 140, digital-to-analog converters, etc.) of the present example includes an interconnect 711 that couples computer readable storage media 712 such as a non-transitory type of media (or hardware storage media) in which digital information can be stored and retrieved, a processor 713 (e.g., computer processor hardware such as one or more processor devices), I/O interface 714, and a communications interface 717.

I/O interface 714 provides connectivity to any suitable resources such as a respective resource storing adjustment information 250. As previously discussed, adjustment information 250 facilitates generation of an offset value (common mode setting) applied to the respective differential signal 118 depending on a level or setting of the input signal 115.

Computer readable storage medium 712 can be any hardware storage resource or device such as memory, optical storage, hard drive, floppy disk, etc. In one embodiment, the computer readable storage medium 712 stores instructions and/or data used by the dynamic common mode adjustor application 140-1 to perform any of the operations as described herein.

Further in this example embodiment, communications interface 717 enables the computer system 700 and processor 713 to communicate over a resource such as network 190 to retrieve information from remote sources and communicate with other computers.

As shown, computer readable storage media 712 is encoded with dynamic common mode adjustor application 140-1 (e.g., software, firmware, etc.) executed by processor 713. Dynamic common mode adjustor application 140-1 can be configured to include instructions to implement any of the operations as discussed herein.

During operation of one embodiment, processor 713 accesses computer readable storage media 712 via the use of interconnect 711 in order to launch, run, execute, interpret or otherwise perform the instructions in dynamic common mode adjustor application 140-1 stored on computer readable storage medium 712.

Execution of the dynamic common mode adjustor application 140-1 produces processing functionality such as control process 140-2 in processor 713. In other words, the dynamic common mode adjustor process 140-2 associated with processor 713 represents one or more aspects of executing dynamic common mode adjustor application 140-1 within or upon the processor 713 in the computer system 700.

In accordance with different embodiments, note that computer system 700 can be a micro-controller device, logic, hardware processor, hybrid analog/digital circuitry, etc., configured to perform any of the operations as described herein.

Functionality supported by the different resources will now be discussed via flowchart in FIG. 8. Note that the steps in the flowcharts below can be executed in any suitable order.

Figure 8:
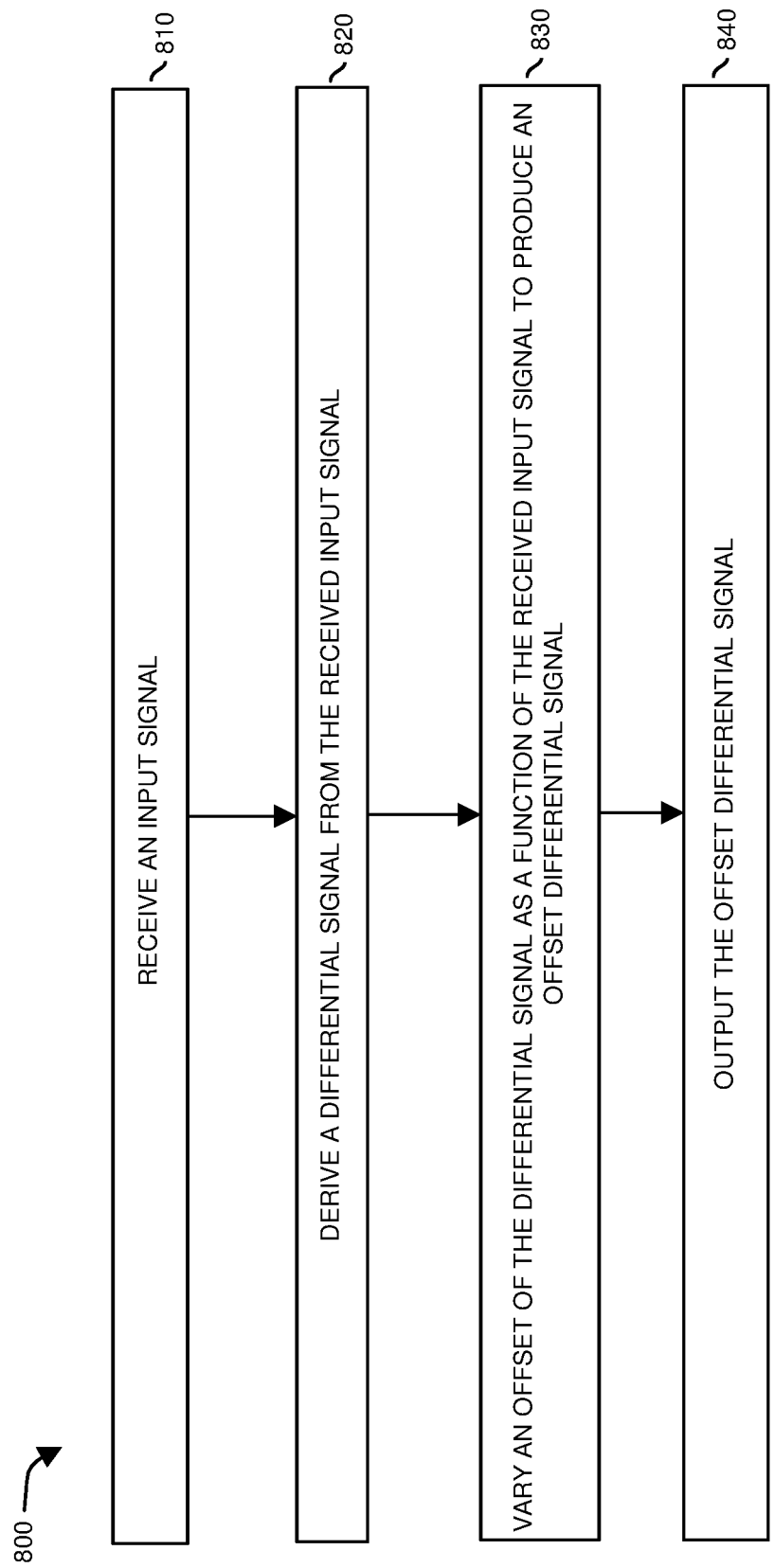
FIG. 8 is an example diagram illustrating a method according to embodiments herein.

FIG. 8 is an example diagram illustrating a method according to embodiments herein.

In processing operation 810, the dynamic common mode adjustor 140 receives an input signal 115 (signal x).

In processing operation 820, the dynamic common mode adjustor 140 derives a differential signal 118 (combination of signal 118-1 and signal 118-2) from the received input signal 115.

In processing operation 830, the dynamic common mode adjustor 140 varies an offset of the differential signal 118 as a function of the received input signal 115 to produce offset differential signal 118.

In processing operation 840, the dynamic common mode adjustor 140 outputs the offset differential signal 118.

Note again that techniques herein are well suited for use in differential signal generators, digital-to-analog converters, electronic circuits, etc. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
an input operable to receive an input signal;
a dynamic common mode adjustor operable to: i) derive a differential signal from the received input signal, and ii) vary a common mode setting of the differential signal as a function of a magnitude of the received input signal to produce an offset differential signal; and
an output operable to output the offset differential signal.

2. The apparatus as in claim 1, wherein the dynamic common mode adjustor varies the differential signal depending on the received input signal.

3. The apparatus as in claim 1, wherein the received input signal is a digital signal; and
wherein the differential signal derived from the received input signal is an analog signal.

4. The apparatus as in claim 1 further comprising:
map information, the map information providing a mapping of input values to corresponding differential output values; and
wherein the dynamic common mode adjustor derives the differential signal via mapping of the received input signal to a first value and second value specified by the mapping information.

5. The apparatus as in claim 1, wherein the dynamic common mode adjustor applies a piece-wise linear math function to derive the offset differential signal from the received input signal.

6. The apparatus as in claim 1, wherein the dynamic common mode adjustor is operable to implement one or more polynomial math functions to derive the offset differential signal from the received input signal.

7. The apparatus as in claim 1, wherein the received input signal is a digital signal; and
wherein the offset differential signal outputted from the output includes a first signal and a second signal, a difference between the second signal and the first signal proportionally varying with respect to the received input signal.

8. The apparatus as in claim 1 further comprising:
a digital-to-analog converter operable to receive the offset differential signal and generate a respective differential analog output signal.

9. The apparatus as in claim 8, wherein the offset differential signal is a pair of signals including a first digital value and a second digital value;
wherein the digital-to-analog converter includes a first digital-to-analog converter and a second digital-to-analog converter, the first digital-to-analog converter operable to convert the first digital value into a first analog output voltage, the second digital-to-analog converter operable to convert the second digital value into a second analog output voltage; and
wherein the respective differential analog output signal includes the first analog output voltage and the second analog output voltage.

10. The apparatus as in claim 1, wherein the dynamic common mode adjustor includes an offset adjustor operable to generate the offset; and
wherein the offset adjustor generates the common mode setting as a fixed value during operating conditions in which the received input signal falls within a first range; and
wherein the offset adjustor varies the common mode setting during operating conditions in which the received input signal falls within a second range.

11. The apparatus as in claim 1, wherein the differential signal includes a first signal and a second signal derived from the input signal;
wherein the common mode setting is an offset; and
wherein the dynamic common mode adjustor is operable to apply the offset to both the first signal and the second signal, a difference between the first signal and the second signal being proportional to the received input signal.

12. A method comprising:
receiving an input signal;
deriving a differential signal from the received input signal;
varying an offset of the differential signal as a function of a magnitude of the received input signal to produce an offset differential signal; and
outputting the offset differential signal.

13. The method as in claim 12 further comprising:
proportionally varying the differential signal depending on the magnitude of the received input signal.

14. The method as in claim 12, wherein the received input signal is a digital signal; and
wherein the offset differential signal derived from the received input signal is an analog signal.

15. The method as in claim 12, wherein deriving the offset differential signal from the received input signal includes:
via mapping information, mapping the received input signal to a first value and second value.

16. The method as in claim 12 further comprising:
implementing a piece-wise linear math function to derive the offset differential signal from the received input signal.

17. The method as in claim 12 further comprising:
implementing one or more polynomial math functions to derive the offset differential signal from the received input signal.

18. The method as in claim 12, wherein the received input signal is a digital signal, the method further comprising:
producing the differential signal to include a first signal and a second signal, a difference between the second signal and the first signal proportionally varying with respect to the received input signal.

19. The method as in claim 12 further comprising:
via a digital-to-analog converter, converting the differential signal into a respective differential analog output voltage signal.

20. The method as in claim 19, wherein the differential signal is a pair of signals including a first digital value and a second digital value, the method further comprising:
converting the first digital value into a first analog output voltage;
converting the second digital value into a second analog output voltage, the respective differential analog output signal including the first analog output voltage and the second analog output voltage.

21. The method as in claim 12 further comprising:
generating a magnitude of the offset as a fixed value during operating conditions in which the received input signal falls within a first range; and
varying the offset during operating conditions in which the received input signal falls within a second range.

22. The method as in claim 12, wherein the differential signal includes a first signal and a second signal derived from the input signal, the method further comprising:
applying the offset to both the first signal and the second signal, a difference between the first signal and second signal being proportional to the receive input signal.

23. Computer-readable storage hardware having instructions stored thereon, the instructions, when carried out by computer processor hardware, cause the computer processor hardware to:
receive an input signal;
derive a differential signal from the received input signal;
vary an offset of the differential signal as a function of a magnitude of the received input signal to produce an offset differential signal; and
output the offset differential signal.

24. The apparatus as in claim 1, wherein the dynamic common mode adjustor is operable to vary a magnitude of the differential signal depending on the magnitude of the received input signal.

25. The apparatus as in claim 1, wherein the common mode setting of the differential signal is an offset voltage applied to the differential signal to produce the offset differential signal.

26. The apparatus as in claim 24, wherein an increase in the magnitude of the received input signal results in an increased magnitude of the offset voltage.

27. The apparatus as in claim 1, wherein the offset differential signal outputted from the output includes a first signal and a second signal, a difference between the second signal and the first signal proportionally varying depending on the magnitude of the received input signal.

28. The apparatus as in claim 1, wherein the dynamic common mode adjustor is further operable to generate the common mode setting as a minimum voltage value during operating conditions in which the magnitude of the received input signal is within a voltage range.

29. The apparatus as in claim 28, wherein the voltage range includes a value of zero volts.

30. The apparatus as in claim 28, wherein the voltage range includes positive and negative voltage values.

31. The apparatus as in claim 1 further comprising:
adjustment information implemented by the dynamic common mode adjustor, the adjustment information indicating different common mode settings applied to the differential signal for different magnitudes of the input signal.

32. The apparatus as in claim 1, wherein the dynamic common mode adjustor is operable to apply a first offset voltage to the differential signal in response to a condition in which the magnitude of the received input signal is a first voltage value; and
wherein the dynamic common mode adjustor is operable to apply a second offset voltage to the differential signal in response to a condition in which the magnitude of the received input signal is a second voltage value.

33. The apparatus as in claim 32, wherein the second voltage value is greater than the first voltage value; and
wherein the second offset voltage is greater than the first offset voltage.

* * * * *